(12) United States Patent
Tailliet

(10) Patent No.: US 9,343,157 B2
(45) Date of Patent: May 17, 2016

(54) WRITING INTO AN EEPROM ON AN I2C BUS

(71) Applicant: STMicroelectronics (Rousset) SAS, Rousset (FR)

(72) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/283,576

(22) Filed: May 21, 2014

(65) Prior Publication Data

US 2014/0347931 A1 Nov. 27, 2014

(30) Foreign Application Priority Data

May 21, 2013 (FR) ..................... 13 54529

(51) Int. Cl.
*G11C 16/10* (2006.01)
*G11C 7/10* (2006.01)

(52) U.S. Cl.
CPC ............ *G11C 16/102* (2013.01); *G11C 7/1039* (2013.01); *G11C 7/1042* (2013.01); *G11C 16/10* (2013.01); *G11C 2207/107* (2013.01); *G11C 2216/30* (2013.01)

(58) Field of Classification Search
None
See application file for complete search history.

(56) References Cited

U.S. PATENT DOCUMENTS

| 5,513,334 | A | 4/1996 | Alexander | |
|---|---|---|---|---|
| 6,173,382 | B1 * | 1/2001 | Dell | ................ G06F 13/1694 365/230.04 |
| 6,336,161 | B1 | 1/2002 | Watts | |
| 6,359,822 | B1 | 3/2002 | Zink et al. | |
| 6,598,114 | B2 | 7/2003 | Funakoshi | |
| 8,923,049 | B2 | 12/2014 | Lee et al. | |
| 2002/0082791 | A1 * | 6/2002 | Tailliet | ................ G11C 7/1045 702/106 |
| 2006/0221704 | A1 * | 10/2006 | Li | ................ G06F 12/0893 365/185.28 |
| 2007/0011394 | A1 | 1/2007 | Hsu | |
| 2008/0005453 | A1 | 1/2008 | Mizuyama | |
| 2008/0235451 | A1 | 9/2008 | Chae | |
| 2011/0010484 | A1 | 1/2011 | Sprouse et al. | |
| 2012/0155182 | A1 | 6/2012 | Kim et al. | |
| 2012/0197852 | A1 | 8/2012 | Dutta et al. | |
| 2012/0197856 | A1 | 8/2012 | Banka et al. | |
| 2012/0197898 | A1 | 8/2012 | Pandey et al. | |
| 2012/0197911 | A1 | 8/2012 | Banka et al. | |
| 2013/0114349 | A1 | 5/2013 | Park et al. | |
| 2014/0347931 | A1 | 11/2014 | Tailliet | |
| 2015/0071007 | A1 | 3/2015 | Lee et al. | |

FOREIGN PATENT DOCUMENTS

EP 1 326 257 A2 7/2003

OTHER PUBLICATIONS

UM10204 specification—NXP Semiconductors. Versoin 4, Oct. 2009—Provided in IDS.*

French Search Report, dated Jan. 29, 2014, for French Application No. 1354530, 2 pages.

(Continued)

*Primary Examiner* — James G Norman

(74) *Attorney, Agent, or Firm* — Seed IP Law Group PLLC

(57) ABSTRACT

An EEPROM circuit includes a data reception register and a column decoder. A buffer memory having a size corresponding to the size of a data page is included between the data reception register and the column decoder.

19 Claims, 12 Drawing Sheets

(56) References Cited

OTHER PUBLICATIONS

French Search Report, dated Apr. 2, 2014, for French Application No. 1354529, 2 pages.

NXP Semiconductors, "I2C-bus specification and user manual", Rev. 5—Oct. 9, 2012, URL: http://www.nxp.com/documents/user_manual/UM10204.pdf, retrieved from internet on Mar. 26, 2013, 64 pages.

* cited by examiner

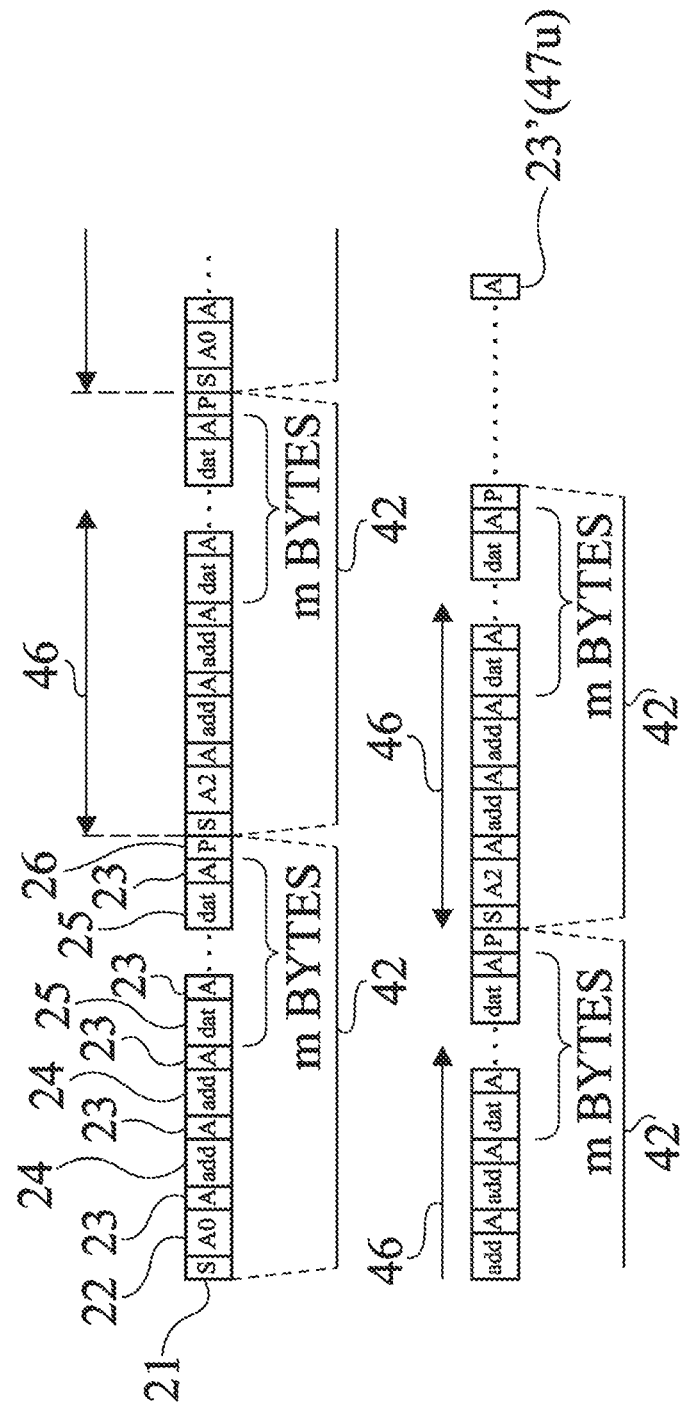

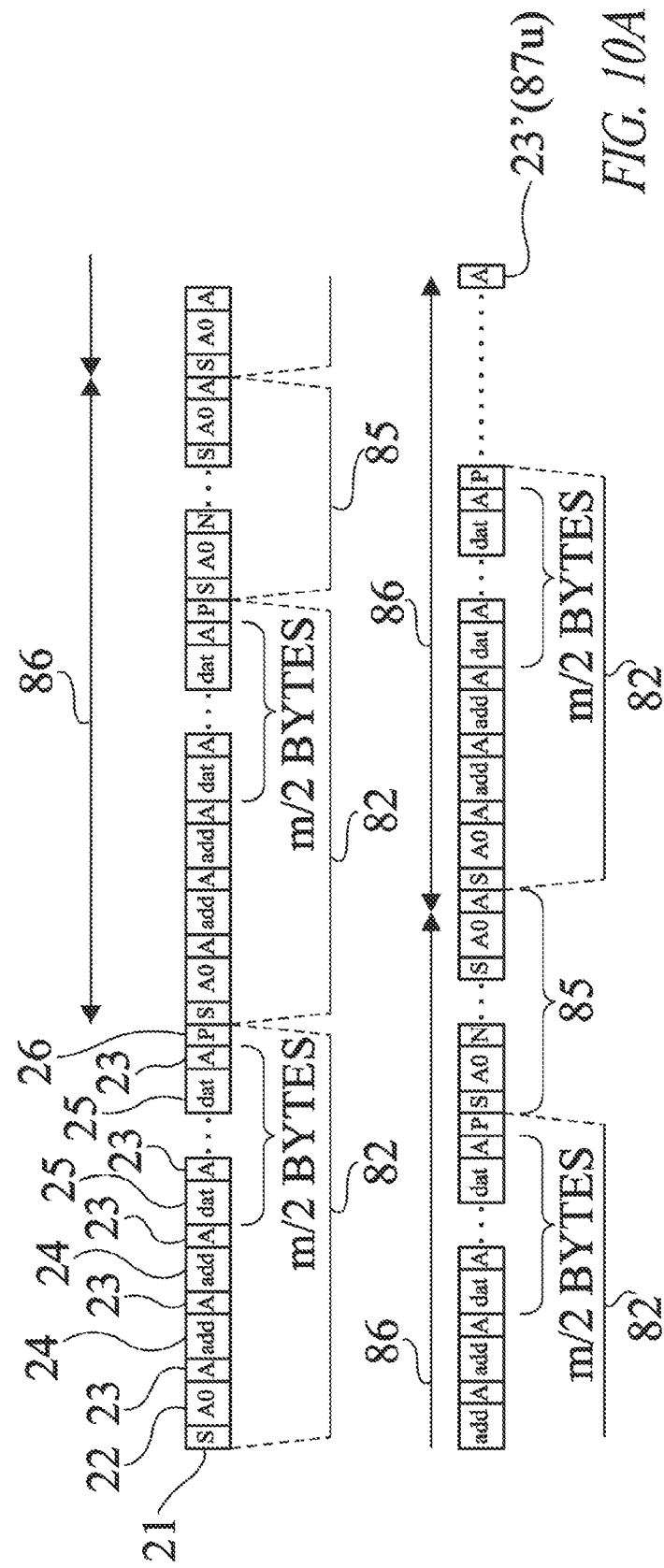

WRITING INTO AN EEPROM ON AN I2C BUS

CROSS-REFERENCE(S) TO RELATED APPLICATION(S)

This application claims the priority benefit of French Patent application number 13/54529, filed on May 21, 2013, entitled "Ecriture d'une mémoire EEPROM sur bus I2C", the content of which is hereby incorporated by.

BACKGROUND

1. Technical Field

The present disclosure generally relates to electronic circuits and, more specifically, to circuits comprising one or several EEPROMs connected to an I2C bus.

2. Description of the Related Art

An I2C bus is a standardized twin-wire bus (e.g., UM10204-I2C-bus specification and user manual Rev. 4-13 Feb. 2012). EEPROMs are devices capable, among others, of being connected to an I2C bus to store data originating from other devices connected to the bus or to provide data to these devices.

A device intending to write data into an EEPROM presents, on the bus, a series of data with the address of their writing into the memory. The memory receives these data, parallelizes them, and programs the corresponding cells. As long as the writing is not ended, the memory sends no acknowledgement signal, so that it refuses to communicate with the bus, thus freeing it for other peripherals which may be available. Once the writing of the series is ended, a next series is presented on the bus by the device.

BRIEF SUMMARY

An embodiment overcomes all or part of the disadvantages of systems comprising an EEPROM on an I2C bus.

Another embodiment accelerates the data writing into an EEPROM connected to an I2C bus.

Another embodiment provides a solution which is compatible with existing I2C buses and which requires no modification of the I2C protocol on the side of the device accessing the memory.

Another embodiment provides a solution more specifically adapted to EEPROMs for which the addressing into the memory uses at least one bit of a slave circuit selection address field.

According to a first aspect, an embodiment provides a solution compatible with the current operation of I2C buses.

According to a second aspect, an embodiment provides a solution which does not modify the data path in the memory.

An EEPROM circuit comprises, between a data reception register and a column decoder, a buffer memory having a size corresponding to the size of a data page.

A method for writing data into an EEPROM connected to an I2C bus is also provided, wherein the data to be written are transmitted by page, the programming of a data page in the memory being performed while another page is being received.

According to an embodiment, the received page is stored in a buffer memory.

According to an embodiment, the memory acknowledges receipt of the data of a page while another page is being programmed.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not intended to convey any information regarding the actual shape of the particular elements and have been selected for ease of recognition in the drawings. One or more embodiments are described hereinafter with reference to the accompanying drawings in which:

FIGS. 5A and 5B schematically illustrate examples of frames adapted to the memory of FIG. 3, according to an embodiment;

FIGS. 10A and 10B schematically illustrate examples of frames adapted to the memory of FIG. 7, according to another embodiment.

DETAILED DESCRIPTION

Figure 1:
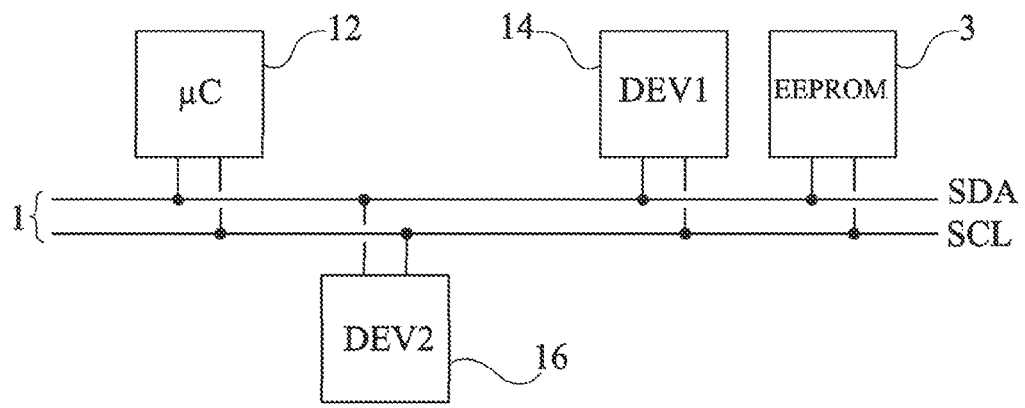
FIG. 1 is a simplified representation of a system comprising electronic devices connected to an I2C bus.

The same elements have been designated with the same reference numerals in the different drawings. For clarity, only those steps and elements which are useful to the understanding of the embodiments which will be described have been shown and will be detailed. In particular, the operation of an I2C bus has not been detailed, the described embodiments being compatible with the usual operation and requiring no modification of the I2C protocol.

FIG. 1 is a simplified representation of a system comprising several electronic devices or circuits connected to a bus 1, of I2C type. The system may be a phone (e.g., cell phone, DECT, or other), radio or television broadcasting equipment, a computer, and more generally any piece of equipment processing digital data.

An I2C bus comprises two conductors SDA and SCL, respectively intended to convey data and a synchronization signal. The I2C protocol is standardized.

Several electronic circuits intended to communicate together are connected to bus 1. Most often, these devices comprise a microcontroller 12 and various circuits or devices 14 (DEV1), 16 (DEV2), for example, volatile or non-volatile memories, decoders, processors, sensors, etc.

In the applications targeted by the present disclosure, one or several reprogrammable non-volatile memory circuits 3 (EEPROM) are connected to bus 1.

In the representation of FIG. 1, only the conductors of bus 1 have been shown. In practice, the system generally comprises other components and circuits 12, 14, 16, and 3 may be connected to various power supply conductors and to other address, data, and control buses which have not been shown.

Figure 2:
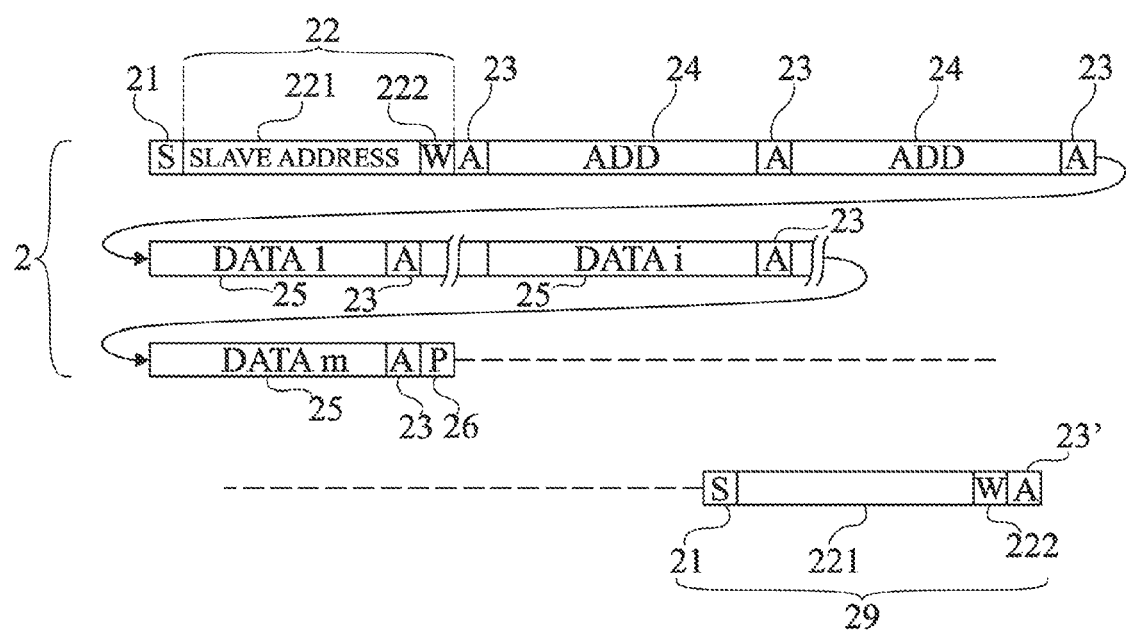
FIG. 2 schematically illustrates a communication frame on an I2C bus.

FIG. 2 shows a usual example of data transmission frame 2 from a master device or circuit to a memory 3 (slave circuit). Although reference will be made hereafter to a microcontroller as the master circuit, what will be described more generally applies to any circuit capable of communicating over an I2C bus.

According to the I2C standard, a frame starts with a start condition 21 (S) followed by a selection byte 22 having a first portion 221 (SLAVE ADDRESS) over 7 bits identifying the addressee and a second portion 222 generally over one bit identifying the operation to be performed on this slave device, that is, data recovery (or reading) (R) or data sending (or writing) (W). For an EEPROM, state 0 or 1 (in logic level) of bit 23 identifies a reading or a programming. Each byte transmitted over the I2C bus is followed by a bit 23 (A) set by the receiver and having a state indicating to the microcontroller whether the byte has or not been received by the memory. Actually, this bit is idle in a state (N) indicative of a lack of reception and, when it has received the byte, the memory switches this bit to a state (A) that the microcontroller decodes as an acknowledgement. Once the slave circuit has been selected (addressed), one or two next bytes 24 (ADD) are used to identify the read or write address in the circuit. Then, the data are transmitted in bytes 25 (DATAi, with i ranging between 1 and m). An acknowledgement bit 23, generated by the device receiving the data, follows each transmitted address or data byte. The end of the frame is marked by a stop condition 26 (P) set by the microcontroller.

Taking the example of an EEPROM 3 having a 1-megabit capacity, frame 2 comprises two address bytes 24 and typically 256 data bytes 25 (m=256) corresponding to the maximum size of a page.

A problem which is encountered with usual EEPROM operating on an I2C bus is that they cannot receive data while they are programming others. In other words, the writing into an EEPROM can be broken up into a phase of reception of the data to be written, in the form of the reception of an I2C frame, followed by a programming phase during which the cells of the array network of the EEPROM are programmed (written).

This translates as the fact that the memory can usually not receive data as long as the programming of a frame is not ended. This conditions the duration of a write operation.

On the I2C bus side, microcontroller 12 should not send data back as long as the memory is not free, since the memory could not process them and they would be lost.

According to the microcontroller configuration, either it periodically sends (one after the other) writing attempts until the memory answers (so-called polling mode), or it waits for a determined time delay (applicable if the microcontroller knows beforehand the time necessary for the programming by the memory) before sending a new read or write request frame. In the first case, microcontroller 12 sends, after stop condition 26, one or several writing attempts by initiating a frame 29 with a start condition 21, memory address 221, and a bit 222 requesting a writing (W). As long as the memory is busy, it sends no acknowledgement 23' (the bit remains in the idle state). Once the memory has answered by setting the acknowledgement bit 23' (A), the microcontroller sends back a write frame 2, starting back from the beginning.

It would be desirable to shorten the duration of a write operation.

It could be devised to increase the bus clock frequency to accelerate the data transmission rate in the memory. However, an I2C bus is, due to its nature, limited in terms of frequency. In practice, it is difficult to manage an I2C bus at a frequency greater than one megahertz (1 MHz). This further introduces constraints relative to the components, which increase their cost.

According to the present disclosure, it is provided for the EEPROM to accept data from the I2C bus while it is writing other data into its cells. Thus, a buffer function (virtual or real) is added to the EEPROM, thus enabling, in write mode, to receive data while the cells are being programmed.

It could be devised to interpose, between the connection of the EEPROM circuit and the bus, a RAM used as a buffer memory. This would however only transpose the problem to the connection between the RAM and the EEPROM, since the RAM would then have to wait for the EEPROM to have finished programming these cells to send new data thereto.

A constraint is that, in order for the memory to operate properly over the I2C bus, the modifications made thereto and to its operating mode should be transparent for the bus, that is, the I2C frame structure should be respected.

Address byte 24 or the two address bytes 24 of the I2C frame condition(s) the addressing capacity of the memory (1 byte limits to 16 kbits, 2 bytes limits to 512 kbits). The addressing capacity may however be extended to 4 Mbits by using from 1 to 3 bits of slave device selection byte 22 (slave device address field 221).

EEPROMs operating with an I2C bus can thus be divided into two large categories: memories having a capacity which requires using, in addition to the one or two address byte(s) 24 of the I2C frame, one or several bits of selection byte 22, and memories for which the one or two address byte(s) 24 of the I2C frame are sufficient. In practice, the first category concerns memories of more than 2 kbits (4 kbits and more) if a single address byte 24 is used (so-called I2C addressing mode) and memories of more than 512 kbits (1 Mbits and more) if two address bytes 24 are used (so-called extended I2C addressing mode).

The inventor has observed that, for memories of the first category in extended I2C mode, that is, memories of more than 512 kbits, the size of a page (determined by the number of bit lines (columns) processed by the decoder) is 256 bytes for memories of 1 and 2 Mbits. As for I2C-mode memories (a single address bit), or memories having a capacity of at most 16 kbits, the size of a page is 16 bytes.

For memories of the second category in extended I2C mode, the size of a page typically is 128 bytes for a 512-kbit memory, 64 bytes for a memory of 256 or of 128 kbits, and 32 bytes for a memory of 64 kbits or of 32 kbits.

Currently, the size of a frame 2 sent over bus I2C in write mode corresponds to the size of a page. This optimizes the loading into the memory.

According to a first aspect, it is aimed at preserving the currently-used page size and thus at not modifying the frame size on the microcontrollers side.

Figure 3:
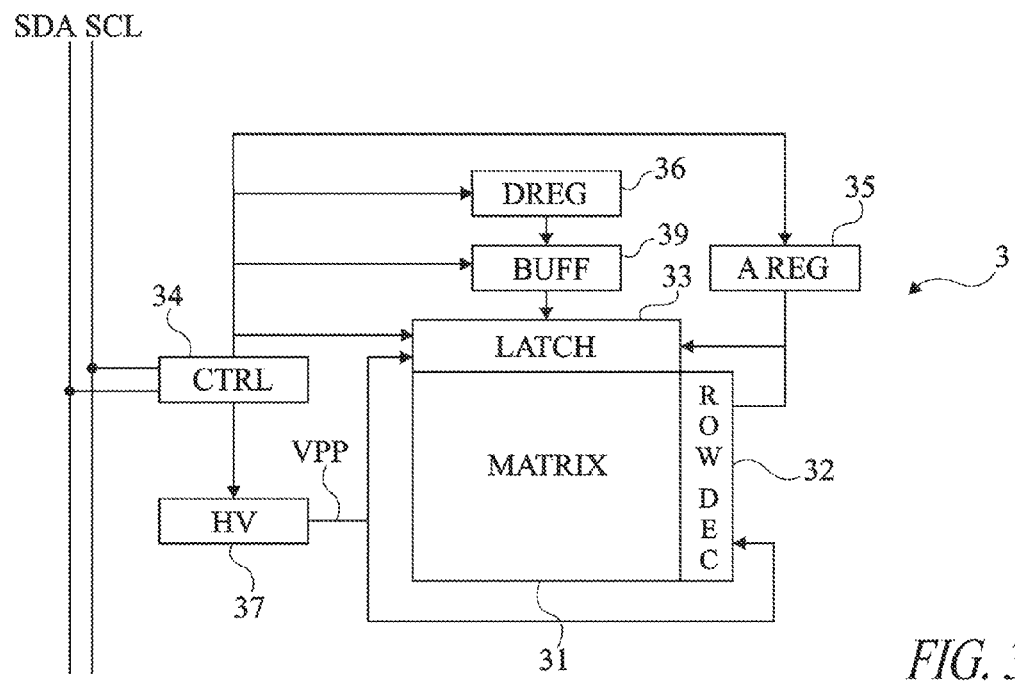
FIG. 3 is a representation in the form of blocks of an embodiment of a memory according to a first aspect.

FIG. 3 is a simplified block diagram of a memory 3 according to this first aspect.

Usually, the memory comprises a memory plane 31 (MATRIX) formed of an array network of memory cells (not shown). Plane 31 defines the memory capacity. A row decoder 32 (ROW DEC) decodes the received addresses to select the cells to be programmed. A bit column or line decoder 33 (LATCH) receives the data to be programmed, in rows, that is, the states of the different bits of the addressed row. Decoders 32 and 33 are controlled by a logic circuit 34 (CTRL) which receives the frames of bus I2C and decodes them. The address bytes are sent to an address register 35 (AREG) and the data bytes are sent to a data register 36 (DREG). The circuit further comprises a high-voltage generator 37 (HV) for generating, from a power supply voltage of a few volts, a memory cell programming voltage, for example, on the order of some fifteen volts, higher than the power supply voltage. The above structure corresponds to a usual example of EEPROM.

Data register 36 has the function of parallelizing the data bytes which are received in series from the I2C bus. In practice, it most often is a register over eight bits which, once it has received a byte from the I2C bus, transfers it to decoder 33. Circuit 34 sends an acknowledgement 23 to obtain the next byte. Column decoder 33 temporarily stores these data until the page is complete (actually, until frame-end condition 26 is received), and then sends them onto the bit lines of memory plane 31. This results in the writing in a single go of the cells belonging to the decoded row.

Register 35 has the same function as register 36, but for the addresses that it parallelizes for decoder 32.

In a usual operation, the memory (its control logic 34) only sends an acknowledgement bit 23' for frame 29 (wait phase) once the programming has been performed, that is, once the data have finished being stored, non-volatilely in the memory cells, which generally takes on the order of one millisecond.

According to the embodiment of FIG. 3, it is provided to interpose, between data register 36 and column decoder 33, a buffer memory 39 (volatile memory) having the size of a page of memory plane 32. Such a buffer memory enables to receive a page while a previous page is being written into the memory plane.

This embodiment requires modifying the management of the transmission of the acknowledgement bit by the slave device (the memory). Thus, circuit 34 is parameterized to switch the state of bit 23', and thus to transmit an acknowledgement over the bus, while the memory is in programming mode, that is, the writing of the bits present in the latches (not shown) of bit lines of column decoder 33 is not ended.

Figure 4:
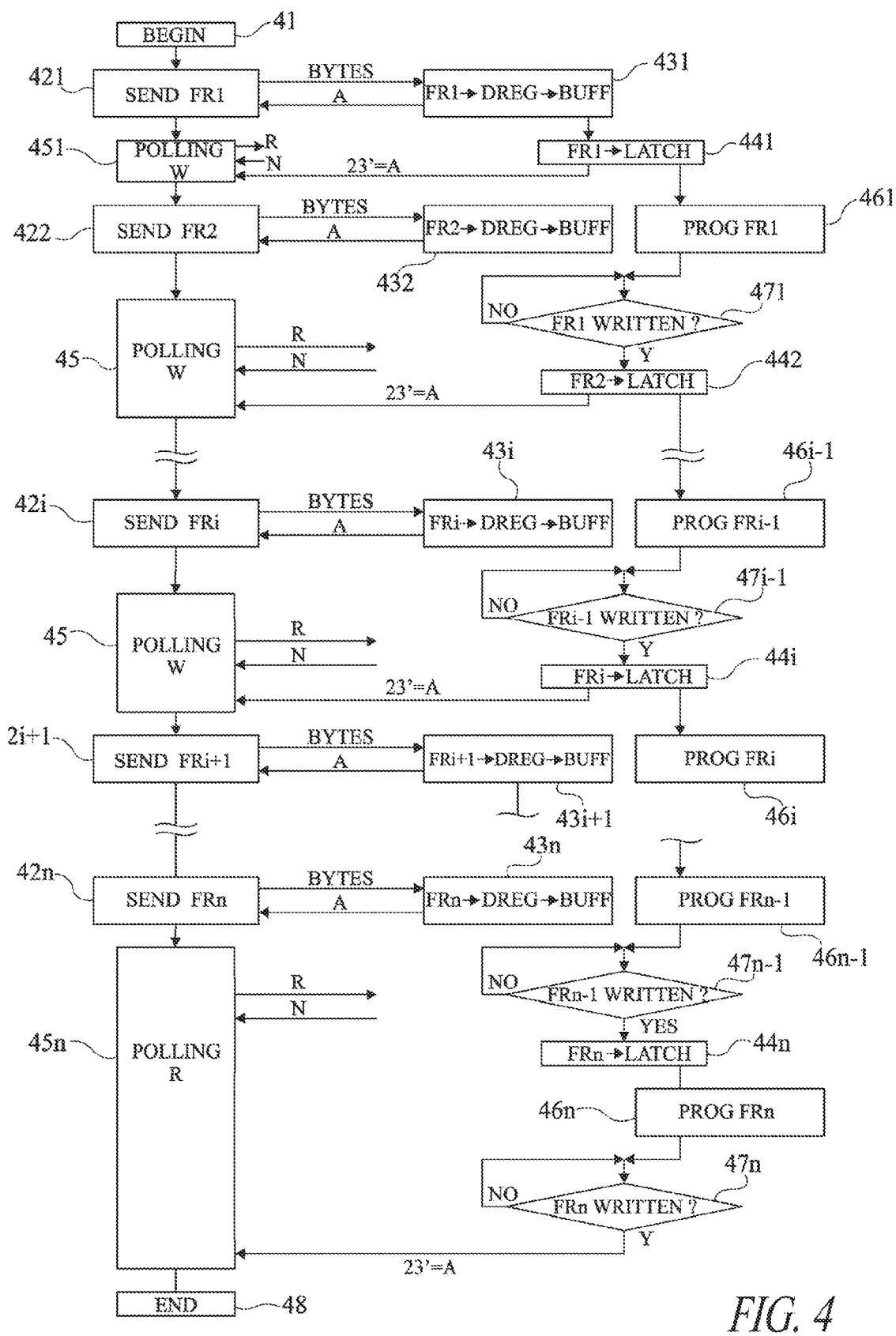
FIG. 4 schematically illustrates an embodiment of the writing process in an EEPROM according to the first aspect of FIG. 3.

FIG. 4 is a block diagram illustrating the operation of this embodiment. The left-hand portion of the drawing illustrates what is happening on the microcontroller side and the right-hand portion illustrates what is happening on the memory side. The operations on the bus are symbolized in the central portion.

The microcontroller starts (block 41, BEGIN) by preparing the data to be sent to the memory.

It sends a first frame FR1 over the bus (block 421, SEND FR1) in the form of successive bytes separated by acknowledgement bits (A). On the memory side, the bytes are successively parallelized by the address and data registers, the data bytes being transferred to buffer memory 39 (block 431, FR1→DREG→BUFF).

Once the page has been received, the content of buffer memory 39 is transferred into the latches of column decoder 33 (block 44, FR1→LATCH). For example, all data are transferred in parallel from buffer memory 39 to decoder 33. As a variation, this transfer may be serialized, for example, in bytes or in words of several bytes, at the cost of a slightly lengthened time, but with the benefit of a simpler circuit. The transfer into the decoder is performed after the memory has received a stop condition indicating the end of the frame transmission.

As for the microcontroller, it is assumed in this example that it sets to a polling mode (block 451, POLLING) by sending frames 29 with bit 222 of the selection byte in state W. Actually, the microcontroller attempts to send the next frame but remains blocked at the level of the first byte as long as the memory does not acknowledge it (bit 23'). As long as the transfer into decoder 33 has not occurred, bit 23' remains in idle state N. As soon as this transfer has been performed, circuit 34 of the memory may set bit 23' to state A. Since it is the first frame, waiting time 451 is decreased since the decoder latches are free (there is no ongoing programming). As a variation, it may be provided for the first frame not to transit through the buffer area and to be directly processed by the column decoder.

This is then followed by both the programming of memory plane 31 with the data of the first page (block 461, PROG FR1) and the sending (block 422, SEND FR2) of second frame FR2 by the microcontroller and the parallelizing and the data transfer, on the memory side, into buffer area 33 (block 432, FR2→DREG→BUFF).

The microcontroller then sets back to the waiting mode (block 45). The duration of the waiting mode is here conditioned by the longest duration between the time necessary to program a frame in the memory plane and the time necessary to transmit a frame over the bus.

If the programming time is the longest of the two (case illustrated in FIG. 4), as long as the memory programming is not ended (output NO of block 471, FR1 WRITTEN?), the content of buffer area 39 can thus not be transferred into decoder 33 and circuit 34 thus leaves bit 23' in the idle state.

As soon as the programming of the page is ended (output Y of block 471), the content of the buffer area (frame FR2) is transferred into the column decoder (block 442, FR2→LATCH), after which circuit 34 activates bit 23' to state A.

If the transmission time is longer than the programming time, the end of the sending of the next frame will be subsequent to the programming of the current frame. Condition 471 will be fulfilled and the polling will immediately provide an acknowledgement on bit 23'.

This operation carries on for all the pages that the microcontroller intends to write, with, for each frame i, the sending thereof (block 42i, SEND FRi) by the microcontroller and its storage in the buffer area of the memory (block 43i, FRi→DREG→BUFF) during the programming (block 46i-1, PROG FRi-1) of the previous frame, the transfer of the frame into the column decoder (block 44i, FRi→LATCH) once the writing of the previous frame is over (block 47i-1, FRi-1 WRITTEN?), and so on (block 42i+1, SEND Fri+1; block 43i+1, FRi+1→DREG→BUFF; block 46i, PROG FRi; etc.).

It may be provided for the microcontroller to ascertain that a programming is over by sending a read control signal. If a programming is ongoing or a frame is waiting in the buffer memory, the memory refuses by leaving bit 23' at state N. However, the memory may accept a write control signal. For example, a read test is started by the microcontroller at the end of the n frames.

During the processing of last frame FRn (block 42n, SEND FRn; block 43n, FRn→DREG→BUFF; etc.), the wait by the microcontroller (block 45n) is then longer since it must be awaited (block 47*n*–1, FRn–1 WRITTEN?) for the end of the programming of frame FRn–1 (block 46*n*–1, PROG FRn–1) to transfer (block 44*n*, FRn→LATCH) frame FRn into the decoder and start its programming (block 46*n*, PROG FRn). Last bit 23' is set to state A at the end of the programming of frame FRn (output Y of block 47*n*, FRn WRITTEN?).

The waiting phase however here is a phase where the microcontroller attempts to read data (bit 222=R) rather than to write some, to make sure that the programming is over.

The writing process is then ended (block 48, END).

As described hereabove, the microcontroller preferably operates in polling mode, that is, until the end of the frame, it sends a write control signal until the memory answers. As a variation, it is possible either to provide a delayed mode with a zero delay (in the case of a programming faster than the frame transmission time), or to adjust the delay to the difference between the duration of the programming and of the transmission.

According to an embodiment intended for the first category of memories (using one, two, or three bits of portion 221 of selection byte 22 for completing address byte or bytes 24), the most significant bit of the address portion contained in field 221 of selection byte 22 is used to organize the management of buffer memory 39 and to program memory plane 31 with the data received from a page while the memory receives the next page. Advantage is taken from the fact that the page size depends on the mode (I2C or extended I2C) but does not vary with the memory size (16 bytes for the I2C mode, and 256 bytes for memories of 1 and 2 Mbits). This is thus easily manageable on the microcontroller side.

The microcontroller starts a frame by sending a selection byte and two address bytes. It however alternates the state of the most significant bit from one frame to the next one. On the memory side, the address bits, contained in byte 22 and in bytes 24, are usually transferred to the address register. However, circuit 34 further interprets the most significant bit of the address to manage the buffer register or memory.

Figure 5A:
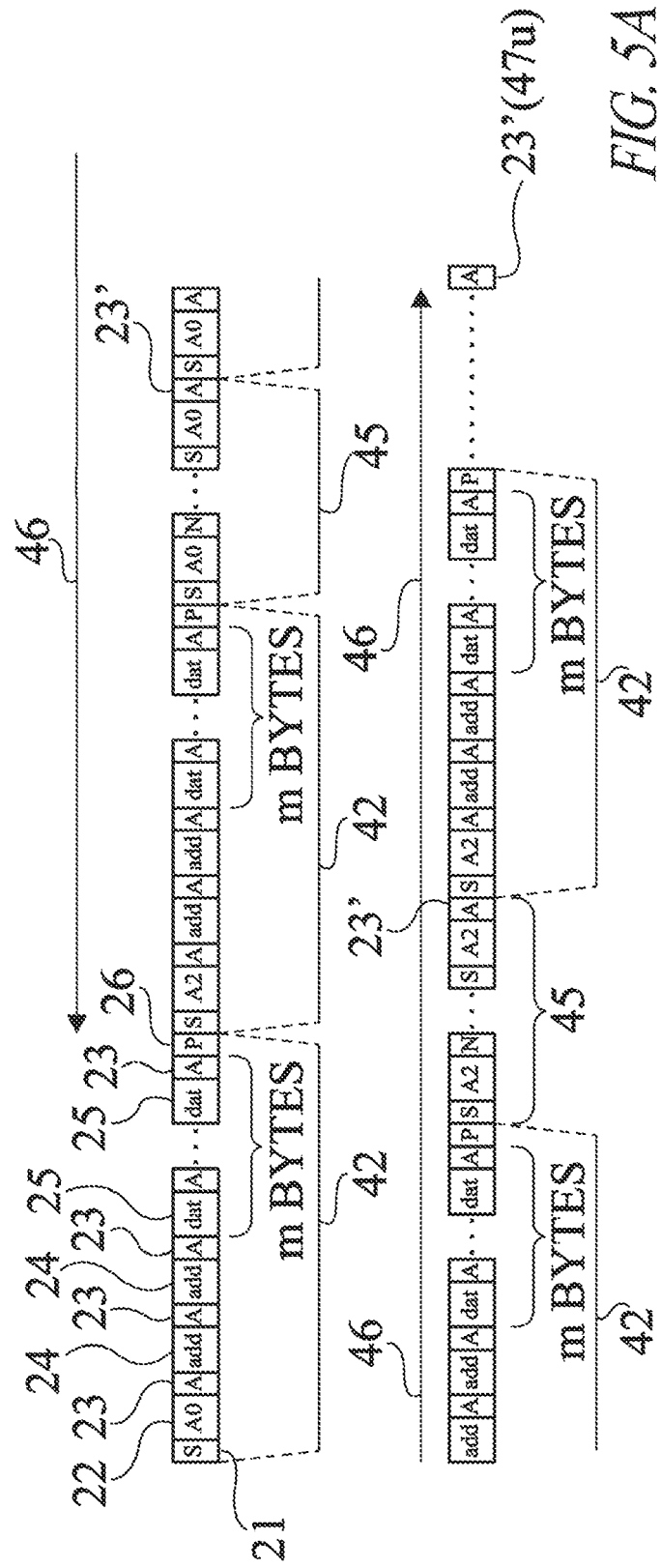

FIGS. 5A and 5B illustrate examples of write frame according to this embodiment, respectively in the case where the programming of a page is slower than the transmission of a frame and conversely. FIGS. 5A and 5B relates to the case of a 1-Mbit memory. In FIGS. 5A and 5B, respective periods 42, 45, and 46 of transmission of the frames by the microcontroller, of waiting, and of programming in the memory array have been identified for n pages (here equivalent to n frames) of m bytes.

The drawings show starting condition 21 (S) and then, for each frame, selection 22, address 24 (add), and data 25 (dat) bytes, separated by acknowledgement bits 23 (A), the frame ending with a stop condition 26 (P). In this embodiment, the content of selection byte 22 differs from one frame to the other and the microcontroller alternates value A0, A2 of the most significant bit of the address portion included in field 221.

FIGS. 5A and 5B illustrate the case where the transmission of the second frame is immediate after the first frame, the buffer area being initially empty (step 451, FIG. 4, decreased to a minimum, or even absent).

After, in the case of FIG. 5A, a waiting phase 45 formed of frames 29 (condition 21, byte 22, bit 23' at state N) is provided between each frame until bit 23' is set to state A by the memory. In this example, the most significant bit of the address alternately takes value A0 or A2 from one waiting phase to the next one.

In the case of FIG. 5B, there is no waiting phase on the microcontroller side. The memory waits since the programming is faster than the transmission. This is illustrated by the absence of phase 45 and the fact that phase 46 is shorter than phase 42.

To make sure that the memory has finished programming, read requests may be performed. Whatever the most significant bit of the address, if the programming operations (ongoing, and possibly waiting in buffer 39) are finished, the memory will send a bit 23' at state A.

According to another embodiment, adapted to the two categories of memories (using a portion of the selection byte or not), the alternation between a page and the next one is performed directly from the frames, the memory identifying the end of a page by the end of the frame (reception of condition 26).

This embodiment has the advantage of being compatible with all memories (including those having a capacity which does not require including address bits in the selection byte).

It should be noted that, whatever the embodiment, the microcontroller knows the size of the memory that it intends to address. It thus knows the size of the page, and thus of the buffer memory. It can then adapt the maximum size of the frame so that it corresponds to the size of a page. It can always send less bytes than comprised in the page. However, if it sends more, the last received bytes overwrite the first ones.

Figure 6A:
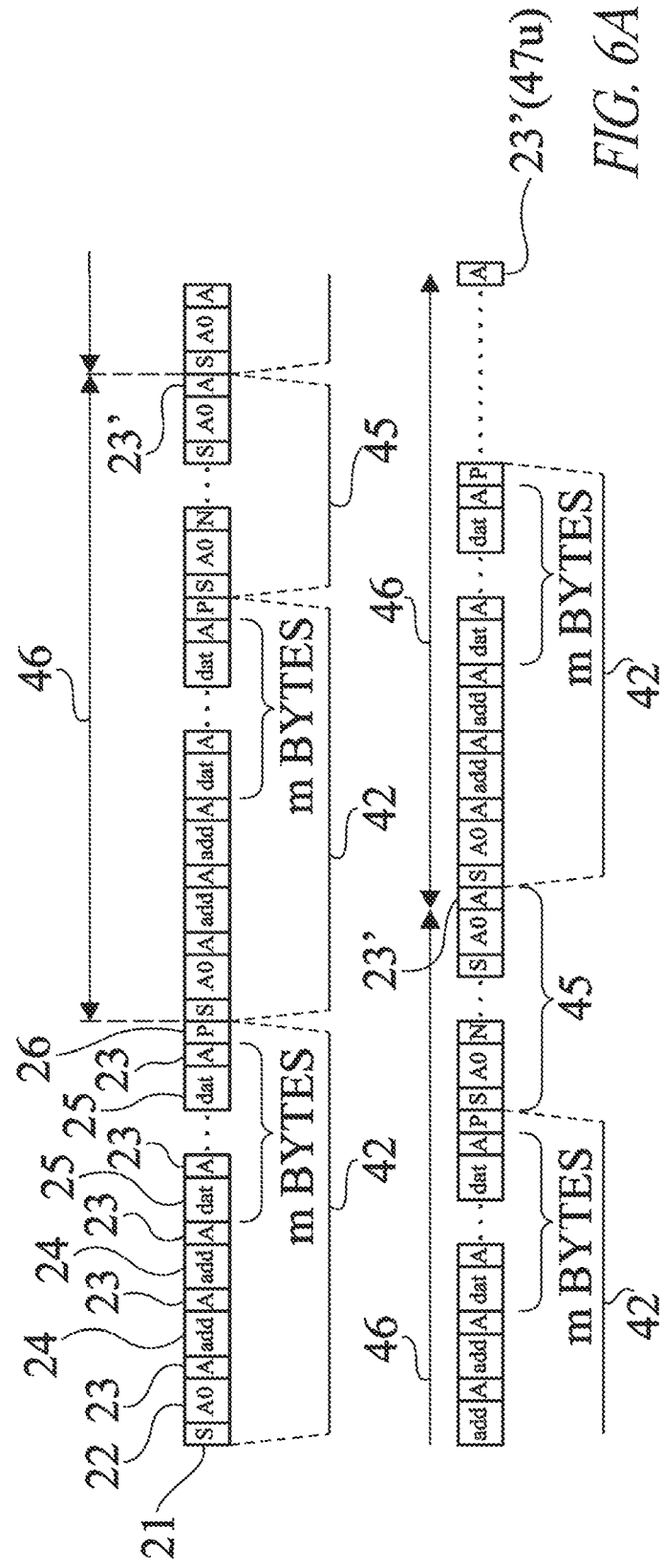
FIGS. 6A and 6B schematically illustrate examples of frames adapted to the memory of FIG. 3, according to another embodiment.
Figure 6B:
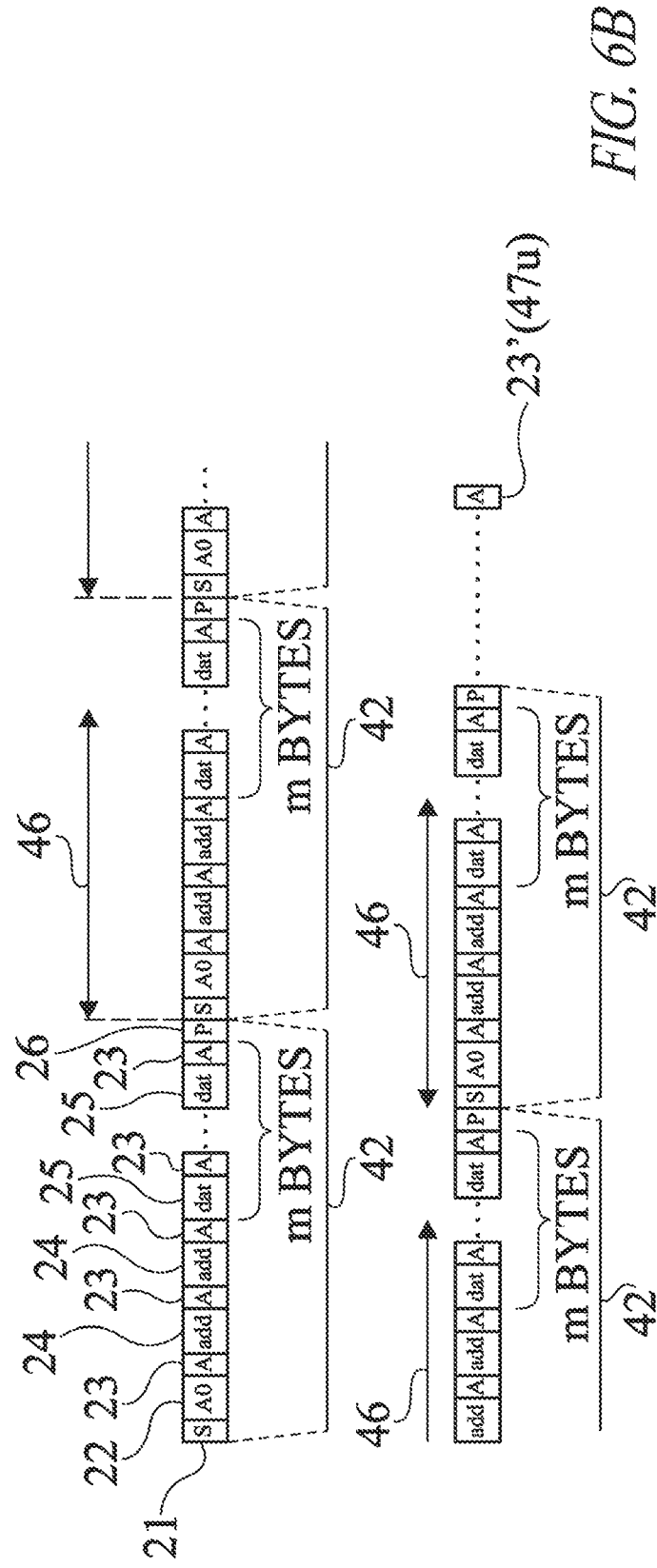

FIGS. 6A and 6B illustrate examples of write frames according to this other embodiment, respectively in the case where the programming of a page is slower than the transmission of a frame and conversely.

As compared with the embodiment illustrated in FIGS. 5A and 5B, a difference is that the microcontroller is not concerned about alternating the most significant bit of the address (this is illustrated in FIGS. 6A and 6B in an example of memory of the second category, byte 22 always having value A0). Another difference is that the memory does not need interpreting this most significant bit. This simplifies the addressing on the microcontroller side. Another advantage of this embodiment is that it is totally transparent for the microcontroller.

The management of the end of frame acknowledgement on read request 29 of the microcontroller is similar to that of the embodiment of FIGS. 5A and 5B.

Whatever the embodiment, the memory operation in read mode is not modified. The data are directly read, in bytes, and transferred from the memory plane to an output data register, not shown.

According to a second aspect, advantage is taken of the presence of the latches present at the column decoder level to behave as a buffer memory. As compared with the first aspect, a difference is that write frames have the size of a half physical page of the memory rather than the size of a page.

Figure 7:
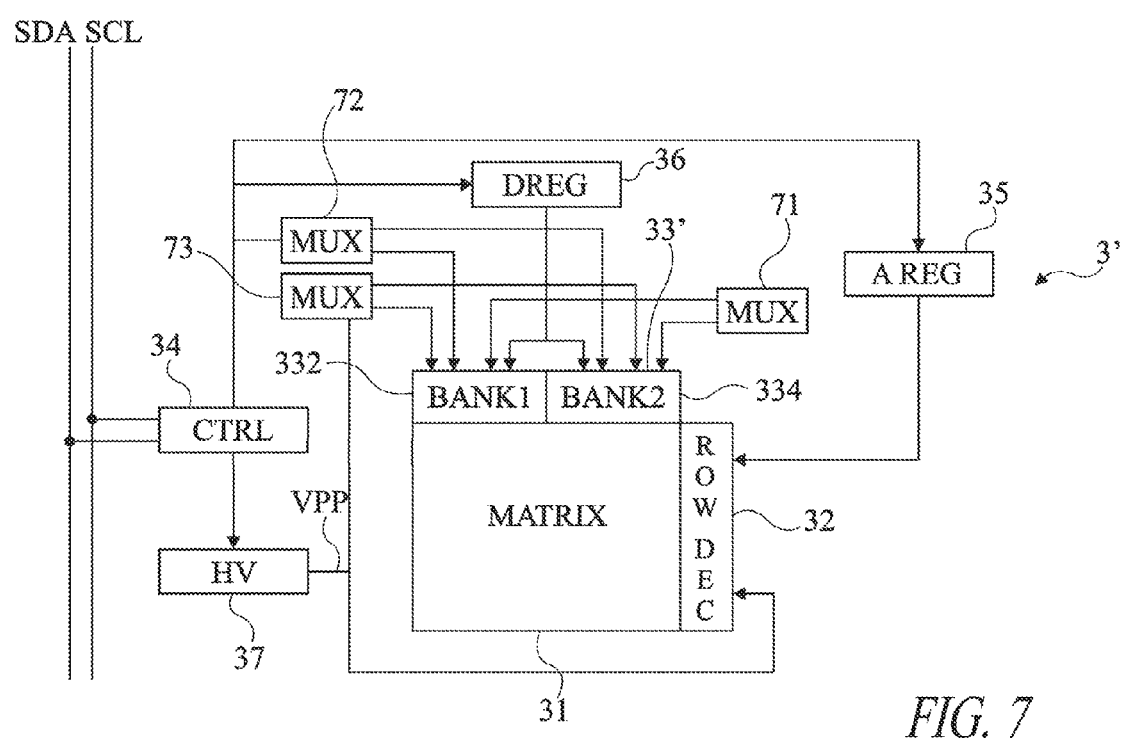
FIG. 7 is a representation in the form of blocks of an embodiment of a memory according to a second aspect.

FIG. 7 is a block diagram of an embodiment of a memory 3' according to this second aspect.

It shows elements 31, 32, 34, 35, 36, and 37 of FIG. 3. However, according to this second aspect, column decoder 33' is divided in two groups or banks of cells: a first group 332 (BANK1) of bit lines corresponds to addresses of higher rank and a second group 334 (BANK2) of bit lines corresponding to addresses of lower rank. The group is identified by the most significant bit of the address. For example, for a memory of 2,048 bit lines (page of 256 bytes), groups 332 and 334 each address 128 bytes. Three multiplexers MUX, respectively 71 between address register 35 and groups 332 and 334, 72 between control circuit 34 and groups 332 and 334, and 73 between power supply circuit 37 and groups 332 and 334, are added. The function of multiplexers 71, 72, and 73 is to branch the data and the high programming voltage towards one or the other of the groups. The selection signals of the multiplexers have not been illustrated. Such signals originate, in practice, from control block 34. As a variation, multiplexer 71 is omitted. It is indeed not disturbing to send the address to both groups, provided for multiplexer 72 to send appropriate control signals in order to only load the data into one of groups 332 and 334.

To preserve the operation of the memory plane, said plane should, on manufacturing, be divided into two groups or two areas addressable separately.

As compared with the first aspect, the addressing performed by the microcontroller is performed by half-page of the memory and not by page. Thus, the microcontroller alternately has to select one or the other of the groups.

Figure 8:
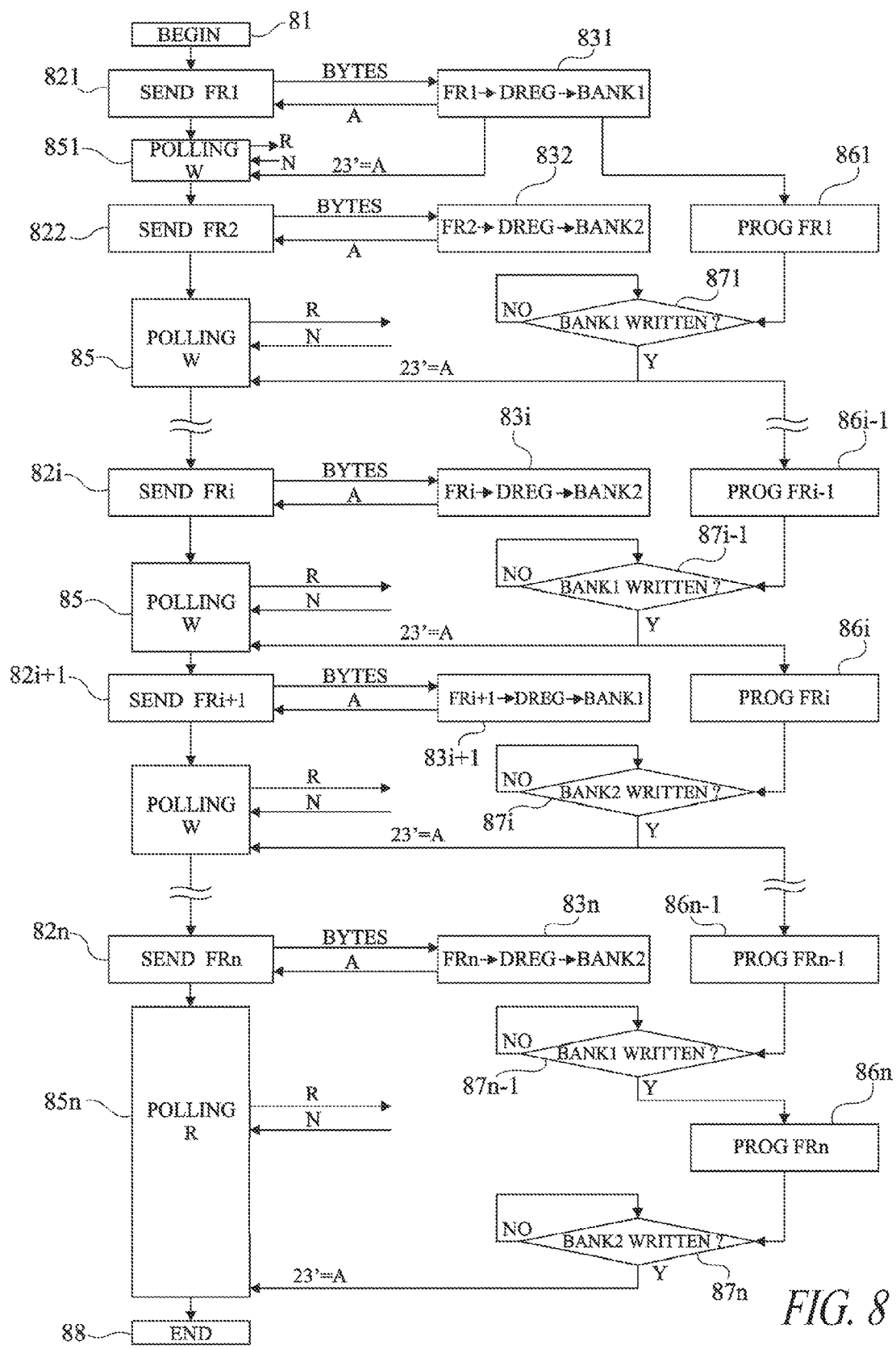
FIG. 8 schematically illustrates an embodiment of the writing process in an EEPROM according to the second aspect of FIG. 7.

FIG. 8 is a block diagram illustrating the operation of this embodiment. The left-hand portion of the drawing illustrates what is happening on the microcontroller side and the right-hand portion illustrates what is happening on the memory side. The operations on the bus are symbolized in the central portion.

The microcontroller starts (block 81, BEGIN) by preparing the data to be sent to the memory.

It sends a first frame FR1 over the bus (block 821, SEND FR1) in the form of successive bytes separated by acknowledgement bits (A). This frame has the size of a half-page of the memory. On the memory side, the bytes are successively parallelized by the address and data registers, the data bytes being transferred (in parallel or partially in series) to the first group of latches of the column register (block 831, FR1→DREG→BANK1).

Once the microcontroller has sent its half-page, it is assumed in this example that it sets to a polling mode (block 851, POLLING) by sending frames 29 with bit 222 of the selection byte at state W.

Once the first half-page has been received, memory circuit 34 sets bit 23' to state A. Since it is the first frame, waiting time 851 is decreased since the transfer in the decoder is fast.

This is then followed by both the programming of memory plane 31 with the data of the first half-page (block 861, PROG FR1) and the sending (block 822, SEND FR2) of second frame FR2 by the microcontroller and its transfer, on the memory side, into the second group of latches of the column register (block 832, FR2→DREG→BANK2).

The microcontroller then sets back to the waiting mode (block 85). The duration of the waiting mode is here conditioned by the longest duration between the time necessary to program a half-page in the memory plane and the time necessary to transmit a frame over the bus.

If the programming time is the longest of the two (case illustrated in FIG. 8), as long as the memory programming is not over (output NO of block 871, FR1 WRITTEN?), the next half-page can thus not be received in decoder 33 and circuit 34 thus leaves bit 23' in the idle state.

As soon as the programming of the page is over (output Y of block 871), circuit 34 activates bit 23' to state A.

If the transmission time is longer than the programming time, condition 871 is immediately fulfilled and bit 23' is at state A from as soon as the first polling request of the microcontroller.

This operation carries on for all the pages that the microcontroller intends to write with, for each half-page i, its sending in a frame (block 82i, SEND FRi) by the microcontroller and its transfer into the group of free latches of the column decoder (block 83i, FRi→DREG→BANK2), arbitrarily group 2, during the programming (block 86i−1, PROG Fri−1) of the previous half-page, the sending of an acknowledgement bit 23' once the writing of the previous frame is over (block 87i−1, BANK1 WRITTEN?), and so on (block 82i+1, SEND FRi; block 83i+1, FRi+1→DREG→BANK1; block 46i, PROG FRi; block 87i, BANK2 WRITTEN?; etc.).

As in the first aspect, the microcontroller ascertains that the programming is over by the sending of read requests.

Thus, during the processing of last half-page or frame FRn (block 82n, SEND FRn; block 83n, FRn→DREG→BANK2; etc.), the wait by the microcontroller (block 85n) is longer since it must be awaited (block 87n−1, BANK1 WRITTEN?) for the end of the programming of frame FRn−1 (block 86n−1, PROG FRn−1) to start the programming of frame FRn (block 86n, PROGFRn). Last bit 23' is set to state A at the end of the programming of frame FRn (output Y of block 87n, BANK2 WRITTEN?).

The writing process is then ended (block 88, END).

In this aspect too, the microcontroller preferably operates in polling mode, that is, until the end of the frame, it sends a write control signal until the memory answers. As a variation, one may either provide a delayed mode with a zero delay (in the case of a programming faster than the frame transmission time), or adjust the delay to the difference between the duration of the programming and of the transmission.

According to an embodiment intended for the first category of memories (using one, two, or three bits of portion 221 of selection byte 22 for completing address byte or bytes 24), the most significant bit of the address portion contained in field 221 of selection byte 22 is used to select group 332 or 334 of latches of column decoder 33 and to program memory plane 31 with the data received from a half-page while the memory receives the next half-page. As for the first aspect, advantage is taken of the fact that the page size depends on the mode (I2C or extended I2C) but does not vary with the memory size (16 bytes for the I2C mode, and 256 bytes for memories of 1 and 2 Mbits). This is thus easily manageable on the microcontroller side.

The microcontroller starts a frame by sending a selection byte and two address bytes. It however alternates the state of the most significant bit from one frame to the next one. On the memory side, the address bits, contained in byte 22 and in bytes 24, are usually transferred to the address register. However, circuit 34 further interprets the most significant bit of the address to manage the addressed group of latches.

Figure 9A:
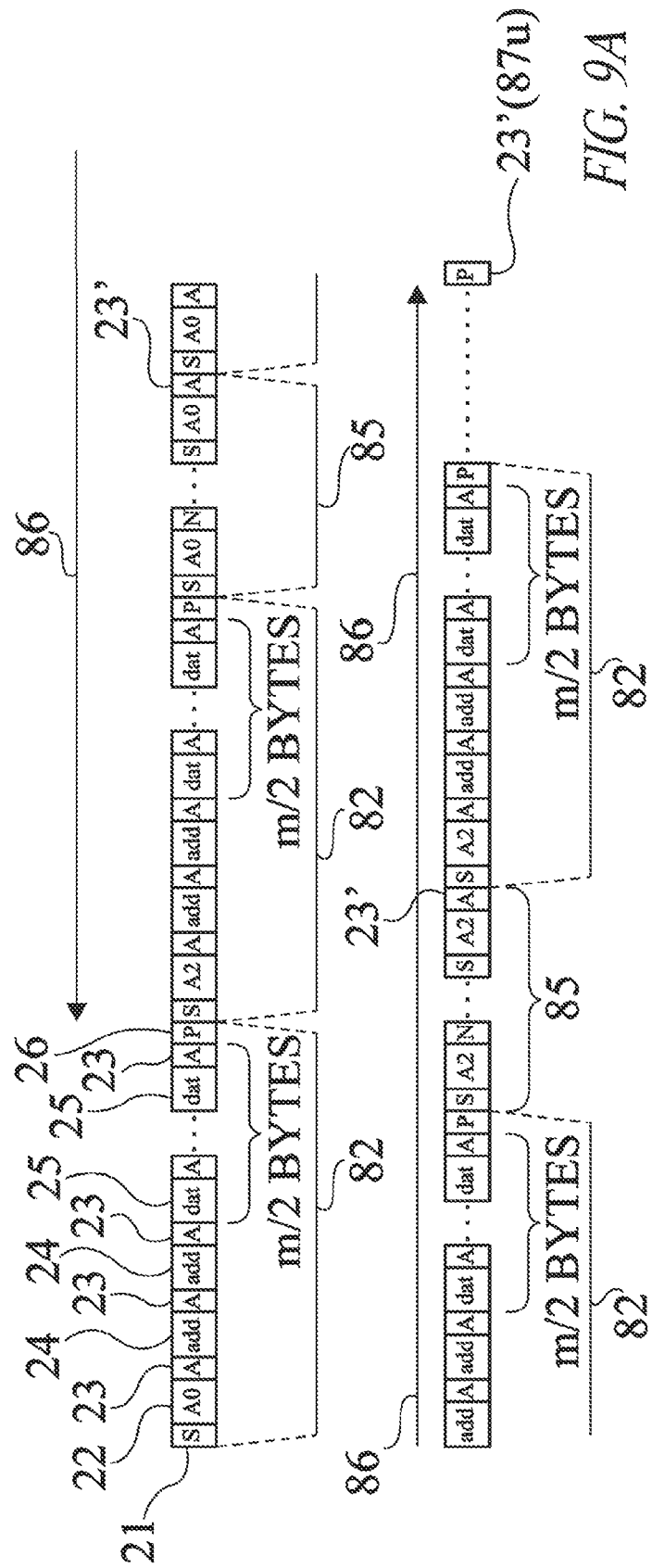
FIGS. 9A and 9B schematically illustrate examples of frames adapted to the memory of FIG. 7, according to an embodiment.
Figure 9B:
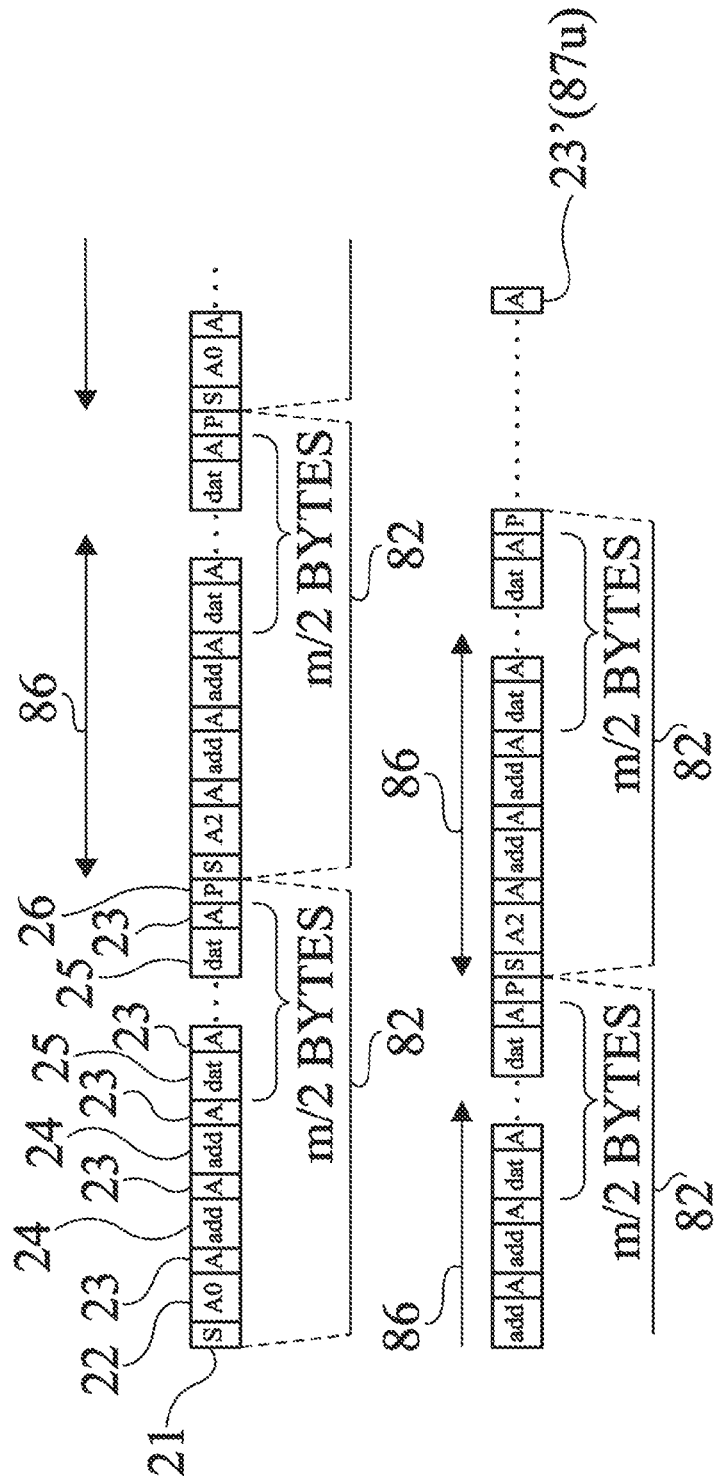

FIGS. 9A and 9B illustrate examples of write frames according to this embodiment, respectively in the case where the programming of a half-page is slower than the transmission of a frame and conversely. FIGS. 9A and 9B relate to the case of a 1-Mbit memory. In FIGS. 9A and 9B, respective periods 82, 85, and 86 of transmission of the frames by the microcontroller, of waiting, and of programming in the memory array have been identified for n half-pages (here equivalent to n frames) of m/2 bytes (m/2 BYTES) plus the acknowledgement bits.

The drawings show starting condition 21 (S) and then, for each frame, selection 22, address 24 (add), and data 25 (dat) bytes, separated by acknowledgement bits 23 (A), the frame ending with a stop condition (P). In this embodiment, the content of selection byte 22 differs from one frame to the other and the microcontroller alternates value A0, A2 of the most significant bit of the address portion included in field 221 to alternately select each of the memory groups.

FIGS. 9A and 9B illustrate the case where the transmission of the second frame is immediate after the first frame, the buffer area being initially empty (step 851, FIG. 4, decreased to a minimum, or even absent).

After, in the case of FIG. 9A, a waiting phase 85 formed of frames 29 (condition 21, byte 22, bit 23' at state N) is present between each frame until bit 23' is set to state A by the memory. In this example, the most significant bit of the address alternately takes value A0 or A2 from one waiting phase to the next one.

In the case of FIG. 9B, there is no waiting phase on the microcontroller side. The memory waits since the programming is faster than the transmission. This is illustrated by the absence of phase 85 and the fact that phase 86 is shorter than phase 82.

To make sure that the memory has finished programming, read requests may be performed. Whatever the most significant bit of the address, if the programming is ended, the memory will send a bit 23' at state A.

According to another embodiment, adapted to the two categories of memories (using a portion of the selection byte or not), the group is identified by the most significant bit, be it or not in the selection byte (for example, case of a 512-kbit memory). The microcontroller should however always, according to the second aspect, alternate the groups from one half-page to the other during the sending.

As in the first aspect, this embodiment has the advantage of being compatible with all memories (e.g., including those having a capacity which does not require including address bits in the selection byte).

As compared with the first aspect, the maximum size of a frame that the memory is capable of taking into account here corresponds to the size of a half-page.

Figure 10B:
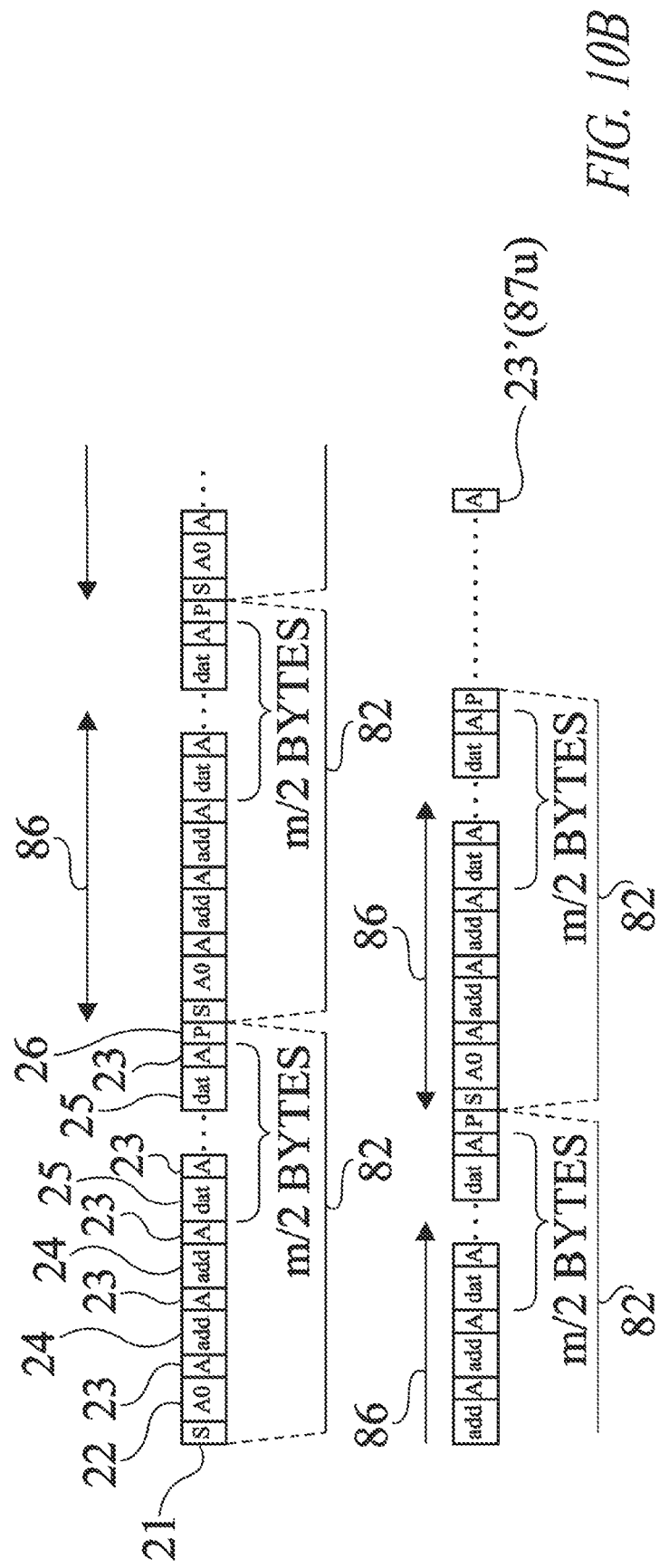

FIGS. 10A and 10B illustrate examples of write frames according to this other embodiment, respectively in the case where the programming of a page is slower than the transmission of a frame and conversely.

As compared with the embodiment illustrated in FIGS. 9A and 9B, a difference is that the microcontroller is not concerned about alternating the most significant bit of the address (this is illustrated in FIGS. 10A and 10B in an example of memory of the second category, byte 22 always having value A0). Another difference is that the memory does not need interpreting this most significant bit. This simplifies the addressing on the microcontroller side. Another advantage of this embodiment is that it is totally transparent for the microcontroller.

The management of the end-of-frame acknowledgement on read request 29 of the microcontroller is similar to that of the embodiment of FIGS. 9A and 9B.

As for the first aspect, whatever the embodiment, the memory operation in read mode is not modified. The data are directly read, in bytes, and transferred from the memory plane to an output data register, not shown.

It should be noted that the architecture described in relation with the second aspect may be compatible with a use with full pages (group 1+group 2). Control circuit 34 and the multiplexers just have to be able to address both groups at the same time. In this case, the advantage of rapidity due to a transmission during the programming is lost. This however enables the microcontroller to conventionally transmit data in full pages.

Various embodiments have been described. Various alterations, modifications, and improvements will occur to those skilled in the art. In particular, the choice between the first and the second aspect and between the different embodiments may be dictated by the bus speed and the size of the concerned memory to optimize write times. For example, for a 1-Mbit memory, an implementation according to the second aspect will be preferred.

Further, when reference is made to a transmission or a programming by page or half-page, it should be understood that it may be less than one page or less than one half-page according to the amount of data which are desired to be stored. Similarly, the transmission may comprise more than one page or than one half-page, the excess data overwriting the first data.

Further, the practical forming of a memory according to the first or second aspect is within the abilities of those skilled in the art based on the functional indications given hereabove and by using techniques known per se for designing and manufacturing integrated circuits. Similarly, the configuration or programming of the memory so that it processes the frames according to one of the described embodiments and especially so that it sets the acknowledgement bits at the right time is also within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method to write data, comprising:
   providing an EEPROM connected to an I2C bus;
   receiving a first page of data in the EEPROOM via the I2C bus as a write frame, the write frame formed by a sequence of serially received data bytes;
   acknowledging via the I2C bus one or more of the serially received data bytes as the data bytes are received;
   storing the data bytes in a buffer as the data bytes are received;
   receiving an indication of an end of the write frame via the I2C bus;
   after receiving the indication of the end of the write frame, temporarily withholding an acknowledgement of the end of the write frame;
   transferring the data bytes in the buffer to a latch circuit;
   after transferring the data bytes in the buffer to the latch circuit, acknowledging via the I2C bus the indication of the end of the write frame;
   programming the first page of data in the EEPROM; and
   receiving a second page of data in the EEPROM via the I2C bus during the programming of the first page of data in the EEPROM.

2. The method of claim 1, wherein receiving the first page of data comprises:
   storing at least some of the serially received data bytes in the latch circuit before receiving indication of the end of the write frame.

3. The method of claim 1, wherein the act of acknowledging the indication of the end of the write frame occurs after programming the first page of data in the EEPROM has started and before programming the first page of data in the EEPROM has ended.

4. The method of claim 3, wherein the act of acknowledging the indication of the end of the write frame occurs before programming the first page of data in the EEPROM has started.

5. The method of claim 1, wherein the act of receiving the second page of data is complete before the act of programming the first page of data in the EEPROM is complete.

6. The method of claim 1, wherein the act of programming the first page of data in the EEPROM is complete before the act of receiving the second page of data is complete.

7. A memory circuit, comprising:
- a matrix of memory cells organized as a plurality of pages, each page having a size of two raised to the power of an integer N ($2^N$);
- a control circuit coupleable to an I2C bus, the control circuit configured to decode frames passed on the I2C bus;
- at least one decoder coupled to the control circuit, the at least one decoder configured to pass data to an identified plurality of memory cells of the matrix; and
- a buffer memory interposed between the control circuit and the at least one decoder, the buffer memory having a size of at least of one page of the plurality of pages, wherein the control circuit is configured to pass to the buffer memory a first full page of data received on the I2C bus, the first full page of data to be written to the matrix, and wherein the control circuit is further configured to withhold an acknowledgement bit on the I2C bus after a stop condition signal has been received until the first full page of data to be written to the matrix has been passed from the buffer memory to the at least one decoder, and wherein the control circuit is further configured to assert the acknowledgement bit on the I2C after the first full page of data to be written to the matrix has been passed from the buffer memory to the at least one decoder.

8. The memory circuit of claim 7, wherein the control circuit is configured to assert the acknowledgement bit on the I2C bus before the first full page of data stored in the buffer memory is fully programmed into the matrix.

9. The memory circuit of claim 7, wherein the at least one decoder is a row decoder.

10. The memory circuit of claim 7, wherein the control circuit is configured to pass to the buffer memory a second full page of data received on the I2C bus before the first full page of data to be written to the matrix has been written to the matrix.

11. The memory circuit of claim 7, wherein the control circuit is configured to operate according an I2C mode and an extended I2C mode.

12. The memory circuit of claim 7, wherein one full frame of data received on the I2C bus is treated as a full page of data, the one full frame of data passed from the buffer memory to the at least one decoder after the stop condition signal has been received.

13. The memory circuit of claim 7, wherein the control circuit is configured to recognize at least one most significant bit of an address associated with the first full page of data as a page boundary.

14. An EEPROM memory circuit, comprising:
- a data reception register;
- a column decoder;
- a buffer memory coupled between the data reception register and the column decoder, the buffer memory having a size corresponding to a size of a data page of the EEPROM memory circuit;
- an array of memory cells organized into pages;
- an I2C bus interface; and
- a control circuit, the control circuit configured to decode frames passed through the I2C bus interface, wherein after a stop condition signal has been received, the control circuit configured to temporarily withhold an acknowledgement from assertion via the I2C bus interface until after a page of data to be written to the array of memory cells has been received and passed from the buffer memory to the column decoder.

15. The EEPROM memory circuit of claim 14, wherein the control circuit is configured to assert the acknowledgement bit on the I2C bus before the page of data stored in the buffer memory is fully programmed into the array.

16. The EEPROM memory circuit of claim 14, wherein the data reception register is configured to begin receiving a second page of data before the page of data to be written to the array of memory cells has been written to the array of memory cells.

17. The EEPROM memory circuit of claim 14, wherein the data reception register is configured to fully receive a second page of data before the page of data to be written to the array of memory cells has been written to the array of memory cells.

18. The EEPROM memory circuit of claim 14, wherein the control circuit is configured to distinguish between an I2C mode and an extended I2C mode.

19. The EEPROM memory circuit of claim 14, wherein the control circuit is configured to recognize at least one most significant bit of an address associated with the page of data as a page boundary.

* * * * *